United States Patent [19]

Herrmann

[11] Patent Number: 4,917,990
[45] Date of Patent: Apr. 17, 1990

[54] PHOTOSENSITIVE PRINTING PLATE FOR USE IN FLEXOGRAPHIC PRINTING

[75] Inventor: Heinz Herrmann, Wiesbaden, Fed. Rep. of Germany

[73] Assignee: Hoechst Aktiengesellschaft, Frankfurt am Main, Fed. Rep. of Germany

[21] Appl. No.: 276,392

[22] Filed: Nov. 25, 1988

[30] Foreign Application Priority Data

Nov. 28, 1987 [DE] Fed. Rep. of Germany ....... 3740432

[51] Int. Cl.⁴ .......................... G03C 1/80; G03C 1/76
[52] U.S. Cl. .................................... 430/286; 430/271; 430/273; 430/306; 430/327; 430/287
[58] Field of Search ............... 430/271, 273, 306, 327, 430/286, 287

[56] References Cited

U.S. PATENT DOCUMENTS

| | | | |
|---|---|---|---|
| 2,964,401 | 12/1960 | Plambeck, Jr. ..................... | 430/281 |
| 2,993,789 | 7/1961 | Crawford ............................ | 430/281 |
| 3,036,913 | 5/1962 | Burg ................................... | 96/67 |
| 3,990,897 | 11/1976 | Zuerger et al. ..................... | 96/67 |
| 4,197,132 | 4/1980 | Yazawa et al. ................. | 430/306 X |
| 4,265,986 | 5/1981 | Allen et al. .................... | 430/306 X |
| 4,320,188 | 3/1982 | Heinz et al. ........................ | 430/286 |
| 4,332,873 | 6/1982 | Hughes et al. .................. | 430/271 X |
| 4,401,749 | 8/1983 | Hoffmann et al. .................. | 430/271 |
| 4,423,135 | 12/1983 | Chen et al. ......................... | 430/271 |
| 4,430,417 | 2/1984 | Heinz et al. ........................ | 430/286 |
| 4,459,348 | 7/1984 | Jun et al. ............................ | 430/271 |

FOREIGN PATENT DOCUMENTS 0064564 11/1982 European Pat. Off. .
2122762A 1/1984 United Kingdom .

*Primary Examiner*—Paul R. Michl
*Assistant Examiner*—Cynthia Hamilton
*Attorney, Agent, or Firm*—Foley & Lardner, Schwartz, Jeffery, Schwaab, Mack, Blumenthal & Evans

[57] ABSTRACT

A photosensitive printing plate for use in flexographic printing is disclosed, comprising
 (a) a transparent, flexible, dimensionally stable plastic film support,
 (b) an adhesive layer comprising a chlorosulfonated polyethylene, and
 (c) a light-hardenable layer comprising an elastomer.
In the plate, adhesion of the light-hardenable layer to the support is improved.

Additionally a process for the production of said printing plate is disclosed, comprising the steps of:
 coating a transparent, flexible, dimensionally stable plastic film with an adhesive layer comprising a chlorosulfonated polyethylene;
 applying a light-hardenable layer comprising an elastomer to the adhesive layer; and
 exposing the light-hardenable layer through the plastic film without using an original such that a thin, light-hardened lower stratum is formed on that side of the light-hardenable layer which is in contact with the adhesive layer.

15 Claims, No Drawings

PHOTOSENSITIVE PRINTING PLATE FOR USE IN FLEXOGRAPHIC PRINTING

BACKGROUND OF THE INVENTION

The present invention relates to a photosensitive printing plate which is suitable for the production of printing forms for use in flexographic printing.

It is known to produce letterpress or flexographic printing forms by imagewise exposure of light-hardenable, in particular, photopolymerizable layers and washing out the non-hardened layer areas by means of an appropriate solvent. Photosensitive materials of this type are described, for example, in DE-A 22 15 090 and DE-A 29 42 183.

Photosensitive flexographic printing plates usually comprise a multilayer material. In most cases, they are formed of a dimensionally stable support, an adhesive layer, a photopolymerizable or photocrosslinkable elastomeric layer, a non-tacky covering layer and a detachable protective film.

The support may be made of a metal or, preferably, of a dimensionally stable, transparent plastic film. It serves to reinforce and maintain the dimensional stability of the, optionally up to several millimeters thick, elastomeric layer in the printing process. To obtain firm anchoring of the light-hardenable layer to the support an adhesive layer is required, which comprises, for example, a polyurethane or polychloroprene-based one-component or two-component adhesive, as described in DE-A 31 00 175, DE-A 31 07 741, DE-A 24 44 118 and DE-A 31 37 416, a polymerizable layer (US-A 3,036,913) or a mixture of polyvinyl chloride and polyvinyl acetate (DE-A 33 19 676). EP-A 64 564 discloses mixtures of specific polyesters and polyamides, polyurethanes or polyolefins, which are used for the same purpose.

Bonding of the elastic photopolymerizable layer to the support with the aid of solid polymer layers is, in general, effected by hot-laminating at temperatures which cause the adhesive-promoting polymer layer to melt.

Many of the known adhesive layers produce bonds of insufficient strength. When the laminate is heavily stressed during the production or use of the printing form, the flexographic printing layer may become detached from the support.

In the application of two-component adhesives, which has frequently been described, the usually poor storability of the raw materials and the limited pot life of the mixture have a disadvantageous effect. Cured two-component adhesives are, moreover, often difficult to dissolve and, consequently, cleaning of the coating equipment becomes difficult and expensive. In addition, strongly crosslinked layers melt at relatively high temperatures, such that high laminating temperatures are required, which may damage the photopolymer layer.

SUMMARY OF THE INVENTION

Accordingly, it is an object of the present invention to provide a photosensitive flexographic printing plate comprising a dimensionally stable, transparent support and an elastomeric light-hardenable layer which is bonded to the support by an improved adhesive.

Another object of the present invention is to provide a photosensitive flexographic printing plate wherein the adhesive bond is obtainable by simple means and at a moderately elevated temperature.

A further object of the present invention is to provide an improved process for the production of a photosensitive printing plate for use in flexographic printing.

In accomplishing the foregoing objectives, there has been provided, in accordance with one aspect of the present invention, a printing plate for use in flexographic printing comprising: (a) a transparent, flexible, dimensionally stable plastic film support; (b) an adhesive layer comprising a chlorosulfonated polyethylene; and (c) a light-hardenable layer comprising an elastomer. In one preferred embodiment of the present invention the aforesaid adhesive layer further comprises a vinyl chloride/vinylidene chloride copolymer.

In accordance with another aspect of the present invention there is provided a process for the production of a photosensitive printing plate for use in flexographic printing, comprising the steps of: coating a transparent, flexible, dimensionally stable plastic film with an adhesive layer comprising a chlorosulfonated polyethylene; applying a light-hardenable layer comprising an elastomer to the adhesive layer; and exposing the light-hardenable layer through the plastic film without using an original such that a thin, light-hardened lower stratum is formed on that side of the light-hardenable layer which is in contact with the adhesive layer.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF PREFERRED EMBODIMENTS

The light-hardenable compound contained in the light-hardenable layer may comprise a polymer which, upon exposure, is crosslinked to an insoluble state, either by itself or by a photosensitive crosslinking agent. The light-hardenable layer preferably comprises a photopolymerizable layer which, in addition to the elastomeric binder, contains an ethylenically unsaturated compound which can be polymerized by free radicals and a photoinitiator forming free radicals upon exposure. Compositions of this kind are known and are described, for example, in the above-indicated publications.

Elastomers which can be used comprise any types of natural or synthetic rubbers. Preference is given to block copolymers of vinyl compounds, e.g. styrene, and dienes, such as butadiene or isoprene.

Acrylic or methacrylic acid esters of polyhydric alcohols, for example, hexanediol-1,6-diacrylate and hexanediol-1,6-dimethacrylate, are usually employed as polymerizable, ethylenically unsaturated monomers. However, the layer may also contain other esters of acrylic and methacrylic acid with monohydric or polyhydric alcohols. In addition, it is also possible to use other unsaturated monomers, for example, vinyl esters of aliphatic monocarboxylic acids or maleic acid ester and fumaric acid ester, etc.

For one part of the elastomeric binder 0.05 to 0.3 part of an ethylenically unsaturated monomer is used.

A great number of substances can be employed as photoinitiators in the composition. Examples are those which are derived from the parent substance of benzophenones, benzoins, benzils, benzilmonoketals, of fluorenone, thioxanthone, of polynuclear quinones, acridines and quinoxalines; and also trichloromethyl-s-triazines, carbonylmethylene heterocycles containing trihalogenomethyl groups, according to DE-A 33 33 450 or acylphosphine oxide compounds, as described, for example, in DE-A 31 33 419.

In general, the initiators are employed in an amount of 0.01 to 10, preferably 0.05 to 5, percent by weight, based on the non-volatile constituents of the layer.

Moreover, the photopolymerizable layer can contain additive substances which improve the storability, the copying behavior and other properties. Customary additive substances include, for example, inhibitors to prevent thermal polymerization, dyes, antioxidants, antiozonants, plasticizers and fillers.

The photopolymerizable layer can be uniform or comprise several superimposed layers having different compositions. It is, for example, possible to use two-layer photopolymerizable layers, in which, after polymerization, the layer which is remote from the support shows a greater hardness than the layer facing the support. The entire photopolymerizable layer has, in general, a thickness of 0.05 to 7 mm, preferably 0.2 to 5 mm.

As is known in the art, the photopolymerizable layer may be covered by a thin, non-tacky polymer layer which is soluble in the developer, for example, a layer comprising soluble polyamides, and a thicker, peelable protective film. The polymer layer usually has a thickness of 1 to 20 $\mu$m and the protective film is about 50 to 200 $\mu$m thick.

Preferred dimensionally stable support films for the photopolymer layer comprise 50 to 300 $\mu$m thick transparent plastic films, for example, of polyesters, polycarbonates, polyimides and the like. Polyethylene terephthalate films are particularly preferred. If it is intended to arrange the support between a photopolymer layer and a rubber-elastic base sheet, the support may also have a lower thickness, for example, down to 10 $\mu$m. The surface of the polyethylene terephthalate film may have been pretreated, for example, with trichloroacetic acid, or it may possess a thin polymer precoating.

The adhesive layer which is employed according to the present invention and which firmly anchors the photopolymerizable layer to the dimensionally stable support film, comprises a chlorosulfonated polyethylene, preferably combined with vinylidene chloride polymers. The adhesive layer advantageously also contains fillers and/or UV absorbers or substances which form free radicals upon exposure to UV light.

Chlorosulfonated polyethylenes are products which are obtained by reacting polyethylene with chlorine and sulfur dioxide or with sulfuryl chloride and which contain Cl and $SO_2Cl$ groups. It is possible to use any commercial chlorosulfonated polyethylenes having a chlorine content in the range between 24 and 45% and a sulfur content between 1.0 and 1.4%. Optimum results are obtained using the readily soluble, low-viscosity types, for example, a polymer containing 43% of chlorine and 1.1% of sulfur and having a density of 1.26.

Upon laminating—and the subsequent preexposure of the laminate through the adhesive layer—the layers of chlorosulfonated polyethylene produce a firm adhesion to the elastic photopolymerizable layers. However, adhesion to the pretreated polyethylene terephthalate support film is unsatisfactory. In the case of layer weights below about 10 g/m² the adhesive layer readily tears when the laminate is stressed and then becomes detached from the support film. Adhesion to the support film can be markedly improved by adding soluble chlorinecontaining polymers. Substances which are appropriately added comprise, for example, postchlorinated polyvinyl chloride, vinyl chloride/vinyl acetate copolymers having a vinyl chloride content of about 90%, and vinylidene chloride copolymers containing at least 40% of vinylidene chloride. Copolymers which contain approximately equal parts of vinyl chloride and vinylidene chloride are particularly advantageously used. By means of the addition, the weight of the adhesive layer can be reduced to 1 g/m² or less.

The mixing ratio of chlorosulfonated polyethylene and vinyl chloride/vinylidene chloride copolymer can vary within wide limits. It is preferred to use from 1 to 9 parts of copolymer for 1 part of chlorosulfonated polyethylene.

The strength of the laminate formed of support film and photopolymer layer is naturally dependent upon the smoothness of the adhesive layer. Wrinkled or rough adhesive layers yield a higher bond strength than smooth adhesive layers do. Fillers which are added to the adhesive layer to roughen the surface thereof can also lead to improved bonding. Examples of suitable fillers are highly dispersed silicas, kaolin, alumina and aluminum stearate. To avoid filler agglomerates, the pulverulent substances should be dispersed in the solution prepared for the application of the adhesive layer, for example, with the aid of a ball mill.

According to the invention, the adhesive layers can also contain UV absorbers and/or substances which form free radicals under the action of UV light. In a still unclarified manner these substances, when added in appropriate concentrations, improve the strength of the laminate. Useful UV absorbers are found among the di- and trihydroxybenzophenones and the hydroxyphenylbenzotriazoles. Suitable substances which form free radicals upon irradiation with UV light include halohydrocarbons, such as quinaldine tribromide or trichloromethyltriazine derivatives, o-quinone diazides, diazonium salts containing a complex anion and the known photopolymerization initiators, as mentioned above, for example, 9-phenylacridine.

The optimum concentrations of UV absorbers and UV-sensitive substances also depend on the plasticizing effect of these substances and varies between 0.2 and 15%, preferably between 0.5 and 5%, of the polymer mass. The concentration must be kept so low that too great a quantity of substance cannot diffuse into the photopolymerizable layer and there reduce cohesion.

The adhesive layer can also contain additional substances, for example, other polymers, resins and dyes.

For the production of the flexographic printing plate according to the present invention the support film is first coated with the adhesive layer. The components of the adhesive layer are dissolved in a suitable solvent or solvent mixture and applied to the film web. Solvents which can be used are, for example, cyclic ethers, ketones, esters, aromatic hydrocarbons, halohydrocarbons and mixtures prepared of these. Any of the known and conventionally used coating methods can be employed to apply the adhesive coating solution.

Bonding of the photopolymerizable layer to the support film carrying the adhesive layer is appropriately effected by calender coating.

In the process, the surface of the photosensitive layer, which is remote from the support, is covered by a protective film. The protective film generally comprises a support film and a polyamide layer which can readily be detached from the support film and is in contact with the photopolymer layer. The laminating temperature ranges between room temperature and about 150° C. The applicable maximum temperature depends on the laminating speed and must not be so high that the support film is deformed or the photosensitive layer is thermally damaged in the laminating process.

The photopolymerizable layer can be prepared in a known manner, by evaporating a solution of the layer components, by molding a homogeneous kneading mass between parallel plates, or by extruding through a flat sheet die followed by calendering of the web. In the preparation of the photopolymerizable layer according to the last-mentioned method, it is advantageous to join the layer in the hot state, while it is still in the calender, to the support film carrying the adhesive layer and to the protective film. The hot laminating step is then rendered superfluous.

If it is intended to apply a non-photosensitive soft rubber sheet or elastic foam sheet to the back of the support film, both surfaces of the support film must be provided with an adhesive layer. The adhesive layer on the back of the support film can be applied prior to, during, or after joining the support film to the photopolymerizable layer. If the laminate is not prepared in one operation, the unprotected adhesive layer must be covered by a readily peelable film during the laminating process, in order to prevent soiling of the laminator rolls.

By means of the above-described adhesive layers the photopolymerizable layer and the support film are joined without any further post-treatment, to a degree which is adequate for many applications. Bond strength is, however, clearly increased by briefly irradiating the multilayer element with UV light through the support film, for example, for 20 seconds, using a 320 watts fluorescent tube.

The multilayer flexographic printing plate material is processed in a conventional manner to give ready-for-use printing forms. First, a printing plate base is prepared by uniformly exposing the element through the support film. After peeling off the protective film, the opposite surface is exposed through a negative film original. Thereafter, the unexposed, non-hardened areas are washed out with a suitable developer, for example, a mixture of perchloroethylene and n-butanol. The tacky printing form obtained is rendered non-tacky by post-treating, e.g. with bromine water, by reexposing and drying and can then be used for printing.

The examples below describe preferred embodiments of the invention. Unless otherwise indicated, all percentages and quantitative proportions given are to be understood as denoting weight units. Parts by weight (pbw) and parts by volume (pbv) are related as the g is related to the $cm^3$.

The adhesive layers specified in the examples were tested as follows: A commercial flexographic printing plate (Nyloflex FA, BASF) was cut into 2.0 cm wide and approximately 15 cm long strips. The surface of the photopolymerizable layer of a strip was then uncovered by peeling off the protective film and the polyamide skin. The adhesive layer applied to a polyethylene terephthalate film was contacted with the uncovered photopolymer layer and the multilayer element formed was then passed through a laminator. The temperature of the laminator rolls was about 150° C. and the speed of passage amounted to 0.5 m/minute. The multilayer element was exposed through the adhesive layer applied, for 50 seconds using a 320 watts fluorescent tube, and the strength of the laminate was then tested by manually tearing off the support film or by means of a peeling test, in which the peeling force was graphically recorded at a rate of peel of 200 mm/minute.

In all cases the support films used for the adhesive layers comprised 100 $\mu$m or 125 $\mu$m thick commercial polyethylene terephthalate films which had been pretreated with a primer.

EXAMPLE 1

The support film was spin-coated with the following solutions at a spinning rate of approximately 90 rmp:

| (a) | 10 pbw of Hypalon 30[1] | in 90 pbw of toluene |
|---|---|---|
| (b) | 14 pbw of Hypalon 30 | in 90 pbw of toluene |
| (c) | 5 pbw of Hypalon 30 | + 5 pbw of Ixan SGA/1[2] in 90 pbw of toluene/butanone (1:1) |
| (d) | 3 pbw of Hypalon 30 | + 7 pbw of Ixan SGA/1 in 90 pbw of toluene/butanone (3:7) |
| (e) | 2 pbw of Hypalon 30 | + 8 pbw of Ixan SGA/1 in 90 pbw of toluene/butanone (1:4) |
| (f) | 1 pbw of Hypalon 30 | + 9 pbw of Ixan SGA/1 in 90 pbw of toluene/butanone (1:9) |

[1]Hypalon 30 = chlorosulfonated polyethylene, 43% of chlorine, 1.1% of sulfur, density 1.26, manufacturer: Du Pont
[2]Ixan SGA/1 = vinyl chloride/vinylidene chloride copolymer, density 1.55, manufacturer: Solvay After drying for 1 minute at 110° C., layers a and c to f had a layer weight of approximately 5.5 $g/m^2$, the layer weight of b was 11.7 $g/m^2$.

As indicated above, the coated films were laminated to the photopolymerizable layer (PP) and the multilayer material was subsequently exposed.

The results compiled in Table 1 were obtained when the laminate was manually pulled apart.

TABLE 1

| Layer | Result |
|---|---|
| a | adhesive layer (AL) becomes detached from the support |
| b | about 20% separation within PP, about 80% between AL and PP |
| c | about 30% separation within PP, about 70% between AL and PP |
| d | about 70% separation within PP, about 30% between AL and PP |
| e | about 70% separation within PP, about 30% between AL and PP |
| f | about 40% separation within PP, about 60% between AL and PP |

EXAMPLE 2

10 pbw of a filler were, in each case, dispersed in 1000 pbv of an adhesive coating solution comprising 20 pbw of Hypalon 30, 80 pbw of Ixan SGA/1, 180 pbw of toluene and 720 pbw of butanone, with the aid of an agitator ball mill. Support films were spin-coated with the suspensions obtained and dried. The dry layer weights were 5 to 6 $g/m^2$.

In a mechanical peeling test using 2.0 cm wide strips, the laminates prepared with the coated films and comprising support film/adhesive layer/photopolymer layer required the following peeling forces:

AL containing special alumina CTB 86 N/2 cm
AL containing aluminum stearate 1107 approx. 90 N/2 cm*)
(*) separation within the photopolymer layer Using commercial flexographic printing plates, forces in the range from only 5 to 30 N/2cm, at the most up to 80 N/2 cm are required to peel the support film from the photopolymer layer.

EXAMPLE 3

The amounts of UV absorbers or radical-forming substances indicated in Table 2 were dissolved in 100 pbv of the adhesive coating solution specified in Example 2. The support films were spin-coated with the solutions to give dry layer weights of 5 to 6 g/m². As indicated above, the support films carrying the adhesive layers were bonded to the photopolymer layer, exposed and subjected to the peeling test. The forces measured, which were required to separate the laminates are compiled in Table 2.

TABLE 2

| Peeling test using 2.0 cm wide strips | |
|---|---|
| Addition to the adhesive coating solution | Peeling force required |
| no | 78 N/2 cm |
| 0.4 pbw of 2-(2-hydroxy-5-methyl-phenyl)-2H-benzotriazole | approx. 105 N/2 cm* |
| 0.2 pbw of 2-(2-hydroxy-5-methyl-phenyl)-2H-benzotriazole | 108 N/2 cm |
| 1.0 pbw of 2,3,4-trihydroxybenzophenone | approx. 110 N/2 cm* |
| 0.25 pbw of 2,3,4-trihydroxybenzophenone | 100 N/2 cm |
| 0.5 pbw of quinone diazide[1] | approx. 150 N/2 cm* |
| 0.2 pbw of 9-phenylacridine | approx. 170 N/2 cm* |
| 0.1 pbw of 9-phenylacridine | approx. 150 N/2 cm* |
| 0.1 pbw of 2-stilbenyl-4,6-bis-trichloromethyl-s-triazine | 112 N/2 cm |
| 0.5 pbw of quinaldine tribromide + 0.2 g of perylene | approx. 140 N/2 cm* |
| 0.5 pbw of 4-morpholino-2,5-dibutoxy-benzene-diazonium-p-toluene sulfonate | approx. 100 N/2 cm* |

*Separation of the laminate within the photopolymer layer
[1]Ester formed of 2,3,4-trihydroxybenzophenone and 1,2-naphthoquinone-2-diazide-5-sulfonic acid.

EXAMPLE 4

Example 1e was repeated, however, different exposure times were used for the laminate prepared. The following peeling forces resulted:

| exposure for 10 seconds | 88 N/2 cm |
|---|---|
| exposure for 20 seconds | approx. 105 N/2 cm* |
| exposure for 50 seconds | 70 N/2 cm |

*separation within the photopolymer layer

EXAMPLE 5

2 pbw of Hypalon 30 and 8 pbw of Ixan SGA/1 were dissolved in a mixture of 18 pbw of toluene and 72 pbw of butanone. One half of the solution was dyed with 0.03 pbw of Victoria Pure Blue FGA (C.I. Basic Blue 81) and the other half was used without dye addition.

The two solutions were spin-coated onto support films to give a dry layer weight of 3 g/m².

Upon laminating to the photopolymerizable layers of commercial flexographic printing plates both layers yielded products showing an equally good layer adhesion. The quantity of light required for building up a relief base was not changed by the dye addition.

What is claimed is:

1. A photosensitive printing plate for use in flexographic printing comprising:
   (a) a transparent, flexible, dimensionally stable plastic film support;
   (b) an adhesive layer comprising a chlorosulfonated polyethylene; and
   (c) a light-hardenable layer comprising an elastomer.

2. A printing plate as claimed in claim 1, wherein said chlorosulfonated polyethylene has a chlorine content of 24 to 45% by weight.

3. A printing plate as claimed in claim 1, wherein said adhesive layer has a thickness of 0.1 to 50 μm.

4. A printing plate as claimed in claim 1, wherein said adhesive layer additionally comprises a vinyl chloride/vinylidene chloride copolymer.

5. A printing plate as claimed in claim 4, wherein the quantitative ratio between said chlorosulfonated polyethylene and said copolymer is in the range from 1:1 to 1:9.

6. A printing plate as claimed in claim 1, wherein said adhesive layer further comprises a compound absorbing light in the ultraviolet region.

7. A printing plate as claimed in claim 1, wherein said adhesive layer further comprises a finely divided pigment.

8. A printing plate as claimed in claim 1, wherein said adhesive layer further comprises a filler.

9. A printing plate as claimed in claim 1, wherein said light-hardenable layer has been uniformly preexposed through the adhesive layer.

10. A printing plate as claimed in claim 1, wherein said light-hardenable layer is photopolymerizable.

11. A printing plate as claimed in claim 1, wherein said elastomer is a block copolymer of a vinyl compound and a diene.

12. A printing plate as claimed in claim 1, wherein said light-hardenable layer comprises a plurality of superimposed layers having different compositions.

13. A printing plate as claimed in claim 1, wherein said light-hardenable layer has a thickness of 0.05 to 7 mm.

14. A printing plate as claimed in claim 1, wherein said transparent plastic film comprises a polyester film.

15. A process for the production of a photosensitive printing plate for use in flexographic printing which comprises the steps of:
   coating a transparent, flexible, dimensionally stable plastic film with an adhesive layer comprising a chlorosulfonated polyethylene;
   applying a light-hardenable layer comprising an elastomer to the adhesive layer; and
   uniformly exposing the light-hardenable layer through the plastic film such that a thin, light-hardened lower stratum is formed on that side of the light-hardenable layer which is in contact with the adhesive layer.

* * * * *